United States Patent
Frye et al.

(10) Patent No.: US 8,035,458 B2
(45) Date of Patent: Oct. 11, 2011

(54) SEMICONDUCTOR DEVICE AND METHOD OF INTEGRATING BALUN AND RF COUPLER ON A COMMON SUBSTRATE

(75) Inventors: Robert C. Frye, Piscataway, NJ (US); Kai Liu, Phoenix, AZ (US)

(73) Assignee: STATS ChipPAC, Ltd., Singapore (SG)

( * ) Notice: Subject to any disclaimer, the term of this patent is extended or adjusted under 35 U.S.C. 154(b) by 224 days.

(21) Appl. No.: 12/403,234

(22) Filed: Mar. 12, 2009

(65) Prior Publication Data

US 2010/0231317 A1 Sep. 16, 2010

(51) Int. Cl.
*H03H 7/42* (2006.01)
*H01P 5/12* (2006.01)
(52) U.S. Cl. .................... 333/25; 333/109
(58) Field of Classification Search .................. 333/25, 333/26, 109, 116
See application file for complete search history.

(56) References Cited

U.S. PATENT DOCUMENTS

| 7,187,910 B2 | 3/2007 | Kim et al. | |
| 7,305,223 B2 | 12/2007 | Liu et al. | |
| 2009/0221258 A1* | 9/2009 | Steinbuch | ..................... 455/326 |
| 2011/0057742 A1* | 3/2011 | Frye et al. | ..................... 333/26 |

FOREIGN PATENT DOCUMENTS

JP 10-145103 * 5/1998

* cited by examiner

*Primary Examiner* — Dean Takaoka
(74) *Attorney, Agent, or Firm* — Robert K. Atkins; Patent Law Group

(57) ABSTRACT

A semiconductor die has an RF coupler and balun integrated on a common substrate. The RF coupler includes first and second conductive traces formed in close proximity. The RF coupler further includes a resistor. The balun includes a primary coil and two secondary coils. A first capacitor is coupled between first and second terminals of the semiconductor die. A second capacitor is coupled between a third terminal of the semiconductor die and a ground terminal. A third capacitor is coupled between a fourth terminal of the semiconductor die and the ground terminal. A fourth capacitor is coupled between the high side and low side of the primary coil. The integration of the RF coupler and balun on the common substrate offers flexible coupling strength and signal directivity, and further improves electrical performance due to short lead lengths, reduces form factor, and increases manufacturing yield.

31 Claims, 7 Drawing Sheets

SEMICONDUCTOR DEVICE AND METHOD OF INTEGRATING BALUN AND RF COUPLER ON A COMMON SUBSTRATE

FIELD OF THE INVENTION

The present invention relates in general to semiconductor devices and, more particularly, to a semiconductor device having a balun and RF coupler integrated on a common substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Baluns and RF couplers are important components in wireless communication systems. The balun suppresses electrical noise, change impedance, and minimize common-mode noise through electromagnetic coupling. The RF coupler detects transmitted power levels from a power amplifier (PA) or transceiver. Many prior art designs use two discrete, cascaded components to achieve both balun and coupling functions. The balun is implemented as a distributed-line in which size is inversely proportional to the operation frequency. The smaller the operational frequency, the larger the requisite balun. The electromagnetic coupler uses a signal trace and coupler trace to detect transmitted power. In many applications, a 50 ohm impedance matching connection is required between balun and coupler. The discrete components consume a larger area, for example, as surface mount devices (SMD) in a system-in-package (SiP). Yet, consumer demand calls for smaller size which makes miniaturization difficult in lower frequency applications, such as GSM cellular. The multiple-component SMD assembly process typically reduces yield due to defects and assembly errors.

SUMMARY OF THE INVENTION

A need exists to miniaturize baluns and RF couplers for RF signal processing circuits. Accordingly, in one embodiment, the present invention is a semiconductor die comprising a substrate and first and second integrated passive devices (IPD) formed over the substrate. The IPD includes a first conductive trace having a first terminal coupled to a first terminal of the semiconductor die, and a second conductive trace having a first terminal coupled to a second terminal of the semiconductor die. The second conductive trace is formed in proximity to the first conductive trace. A resistor is coupled between a second terminal of the second conductive trace and a ground terminal. The second IPD includes a first inductor having a first terminal coupled to a second terminal of the first conductive trace and a second terminal coupled to the ground terminal, a second inductor having a first terminal coupled to a third terminal of the semiconductor die and a second terminal coupled to the ground terminal, and a third inductor having a first terminal coupled to a fourth terminal of the semiconductor die and a second terminal coupled to the ground terminal. The first inductor is formed in proximity to the second and third inductors.

In another embodiment, the present invention is a semiconductor die comprising a substrate and first and second IPDs formed over the substrate. The first IPD includes a first conductive trace having a first terminal coupled to a ground terminal, and a second conductive trace having a first terminal coupled to a first terminal of the semiconductor die. The second conductive trace is formed in proximity to the first conductive trace. A resistor is coupled between a second terminal of the second conductive trace and the ground terminal. The second IPD includes a first inductor having a first terminal coupled to a second terminal of the semiconductor die and a second terminal coupled to a second terminal of the first conductive trace, a second inductor having a first terminal coupled to a third terminal of the semiconductor die and a second terminal coupled to the ground terminal, and a third inductor having a first terminal coupled to a fourth terminal of the semiconductor die and a second terminal coupled to the ground terminal. The first inductor is formed in proximity to the second and third inductors.

In another embodiment, the present invention is a semiconductor die comprising a substrate and first IPD formed over the substrate. The first IPD includes an RF coupler. A second IPD is formed over the substrate. The second IPD includes a balun electrically connected to the RF coupler.

In another embodiment, the present invention is a method of forming a semiconductor die comprising the steps of providing a substrate and forming a first IPD over the substrate. The first IPD includes an RF coupler. The method further includes the step of forming a second IPD over the substrate. The second IPD includes a balun electrically connected to the RF coupler.

DETAILED DESCRIPTION OF THE DRAWINGS

Figure 1:
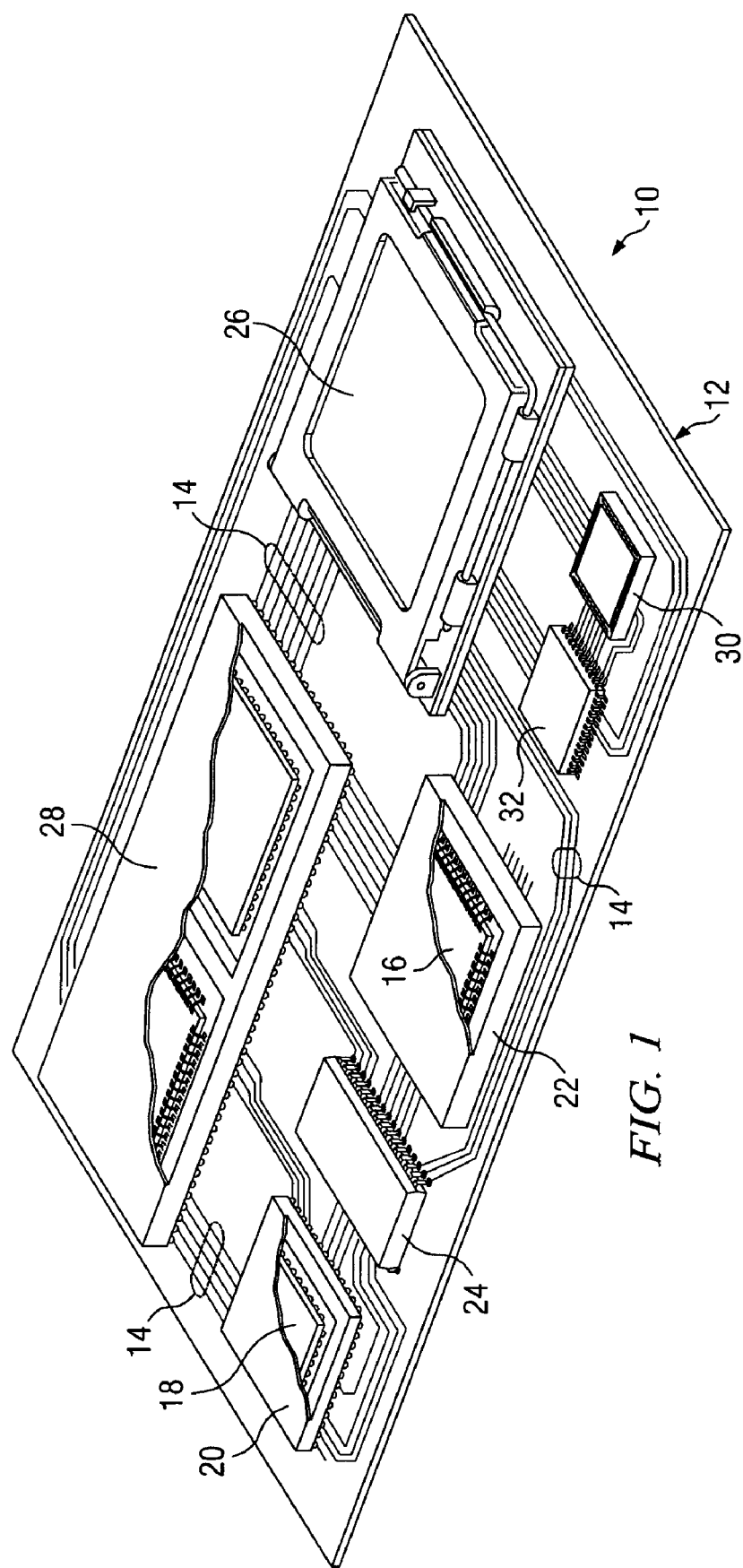
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
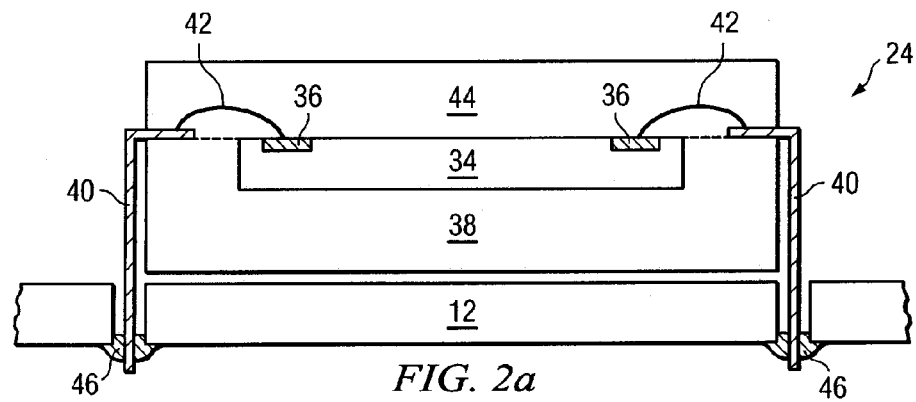
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
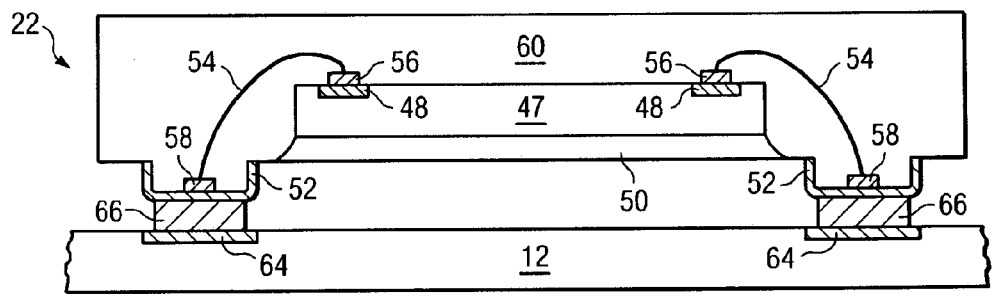

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
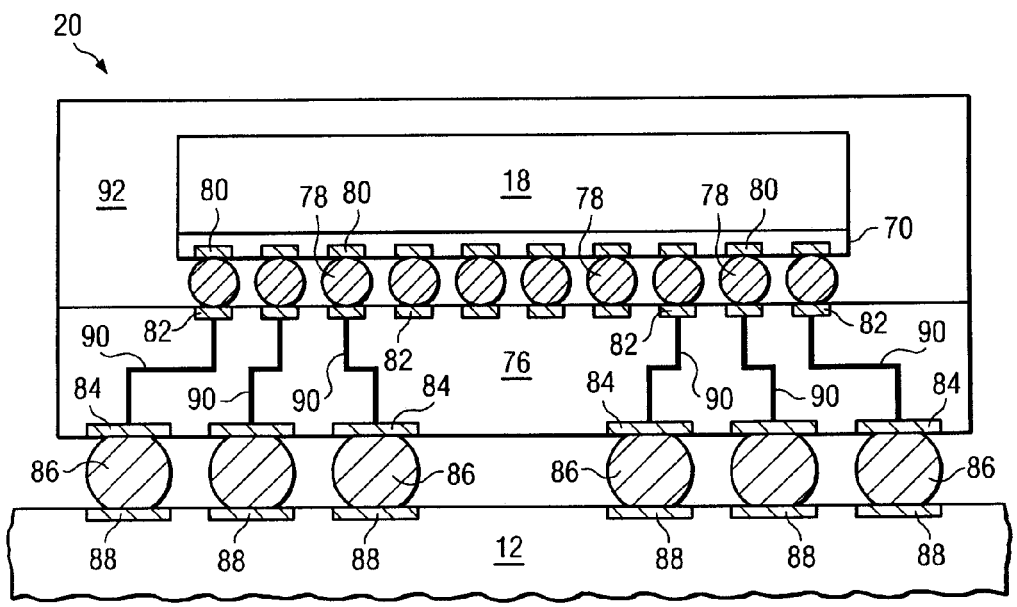

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3:
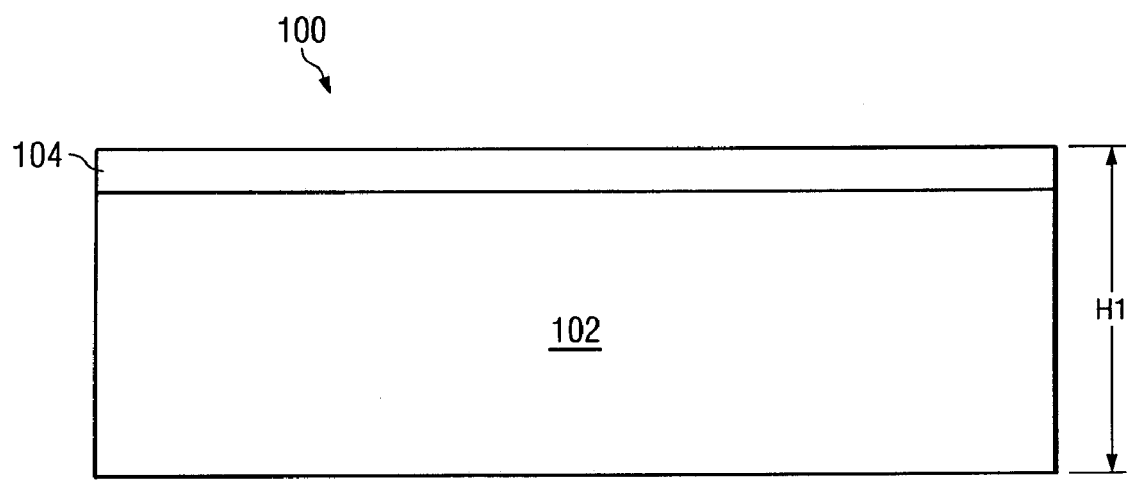
FIG. 3 illustrates a semiconductor package containing integrated passive devices.

Referring to FIG. 3, semiconductor die or package 100 includes a semiconductor substrate 102 which is made of silicon (Si), germanium, gallium arsenide (GaAs), glass, low temperature co-fired ceramic (LTCC), or other bulk semiconductor material for structural support. An active region 104 is formed over the top surface of semiconductor substrate 102. Active region 102 includes active devices and integrated passive devices (IPD), conductive layers, and dielectric layers according to the electrical design of the die. The active devices include transistors, diodes, etc. The IPD may include thin-film inductors, resistors, and capacitors. Active region 102 occupies about 5-10% of the overall thickness or height Hi of semiconductor die 100. In one embodiment, semiconductor die 100 occupies an area 3.2 millimeters (mm) by 2.2 mm. Semiconductor die 100 can be electrically connected to other devices using flipchip, bond wires, or interconnect pins.

Semiconductor devices containing a plurality of IPDs can be used in high frequency applications, such as microwave radar, telecommunications, wireless transceivers, electronic switches, and other devices performing radio frequency (RF) electrical functions. The IPDs provide the electrical characteristics for circuit functions such as baluns (balanced and unbalanced), resonators, high-pass filters, low-pass filters, band-pass filters (BPF), symmetric Hi-Q resonant transformers, matching networks, RF couplers, and tuning capacitors. For example, the IPDs can be used as front-end wireless RF components, which can be positioned between the antenna and transceiver. The wireless application can be a cellular phone using multiple band operation, such as wideband code division multiple access (WCDMA) bands (PCS, IMT, low) and global system mobile communication (GSM) bands (low and high).

In a wireless communication system, the balun suppresses electrical noise, change impedance, and minimize common-mode noise through electromagnetic coupling. In some applications, multiple baluns are formed over a common substrate, allowing multi-band operation. For example, two or more baluns are used in a quad-band for mobile phones or other GSM communications, each balun dedicated for a frequency band of operation of the quad-band device. The RF coupler detects transmitted power levels from a power amplifier (PA) or transceiver. A typical RF system requires multiple IPDs and other high frequency circuits in one or more semiconductor packages to perform the necessary electrical functions.

Figure 4:
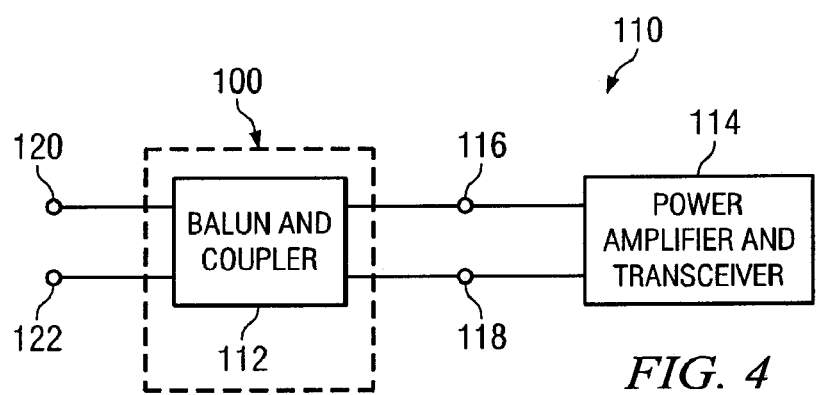
FIG. 4 illustrates a wireless communication system with integrated balun and RF coupler connected to power amplifier and transceiver.

FIG. 4 illustrates a wireless communication system 110 using an RF integrated circuit (RFIC) 112. RFIC 112 contains a balun and RF coupler integrated on a common substrate of a single semiconductor die 100. RFIC 112 is coupled to PA and transceiver 114. PA and transceiver 114 amplify the RF signal for transmission and receive RF signals in full-duplex, and filter and condition the signals for further processing.

RFIC 112 is a 4-port device. Terminal 116 is designated as differential port (1); terminal 118 is designated as differential port (2); terminal 120 is designated as main power out (3); terminal 122 is designated as detect power out (4). The differential ports (1) and (2) connected to PA and transceiver 114. The main power out (3) is a single-ended power output. The detect power out (4) is a coupling-circuit output for detecting transmitter power.

Figure 5:
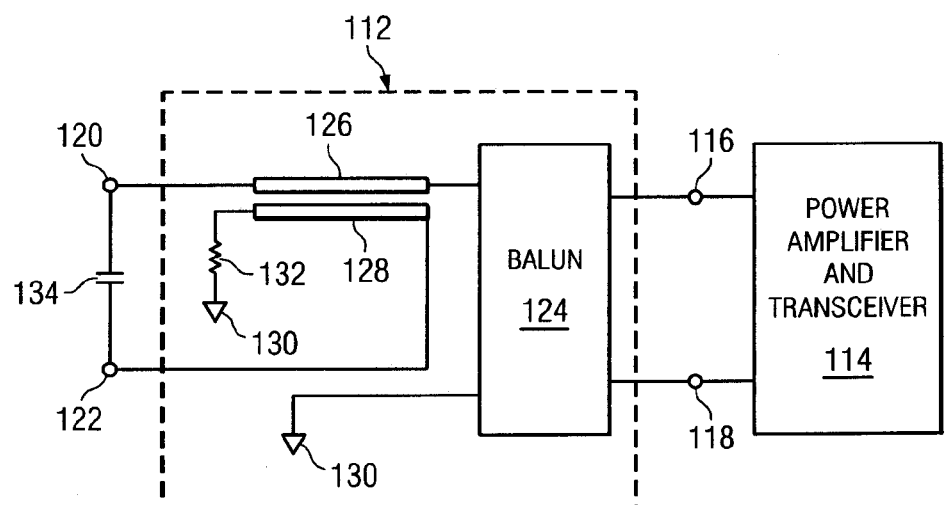
FIG. 5 illustrates further detail of the integrated balun and RF coupler.

FIG. 5 shows further detail of RFIC 112 including balun 124, signal trace 126, and coupler trace 128. Balun 124 is a 3-port IPD device: one port coupled to a first terminal of signal trace 126, one port coupled to terminal 116, and one port coupled to terminal 118. Balun 124 is coupled to ground potential through terminal 130. A second terminal of signal trace 126 is coupled to terminal 120. A first terminal of coupler trace 128 is coupled to terminal 122, and a second terminal of coupler trace 128 is coupled through resistor 132 to ground terminal 130. Resistor 132 enables signal directivity. A capacitor 134 is coupled between terminal 120 and terminal 122.

The RF coupler circuit, including signal trace 126, coupler trace 128, resistor 132, and capacitor 134, constitutes an IPD. The RF coupler circuit detects transmitted power through inductive coupling and capacitive coupling between signal trace 126 and coupler trace 128. Note that resistor 132 and capacitor 134 do not share a common node. The coupler trace 128 is disposed in close proximity to signal trace 126, which in turn is coupled to a high side of the primary coil or inductor of balun 124. The detected transmitted power is provided on terminal 122.

Figure 6:
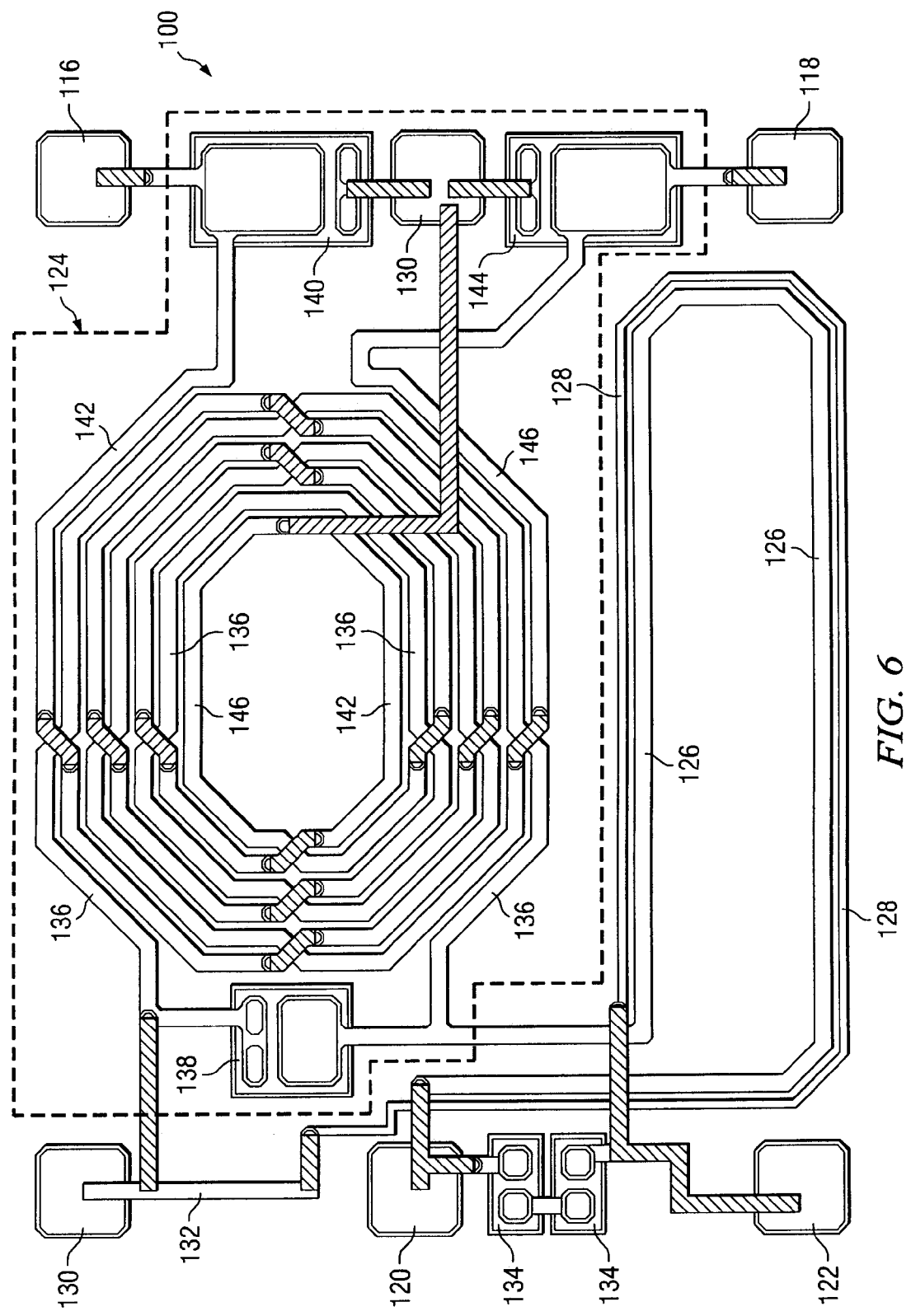
FIG. 6 illustrates a physical circuit layout of the integrated balun and RF coupler.

FIG. 6 shows a physical circuit layout of RFIC 112 integrated in a small form factor on a common substrate of semiconductor die 100. Terminal 120 is coupled to the first terminal of signal trace 126. The second terminal of signal trace 126 is coupled to primary coil or inductor 136 of balun 124. Coupler trace 128 is placed along a substantial length of and in close physical proximity to signal trace 126, separated by 10 micrometers (μm). Signal trace 126 and coupler trace 128 can be one or more layers of Al, Cu, Sn, Ni, Au, Ag, or other suitable electrically conductive material. Signal trace 126 and coupler trace 128 are formed using evaporation, sputtering, PVD, CVD, electrolytic plating, electroless plating process, or other suitable metal deposition process. The first terminal of coupler trace 128 is coupled to terminal 122, and the second terminal of coupler trace 128 is coupled through resistor strip 132 to ground terminal 130. Capacitor 134 is coupled between terminal 120 and terminal 122. Capacitor 134 can be implemented as two smaller-value capacitors connected in series as shown for better tolerance during the manufacturing process.

Balun 124 further includes capacitor 138 coupled between the high side of primary coil 136 and the low side of primary coil 136, which in turn is coupled to ground terminal 130. A capacitor 140 is coupled between terminal 116 and ground terminals 130. Terminal 116 is also coupled to secondary coil or inductor 142 of balun 124. A capacitor 144 is coupled between terminal 118 and ground terminal 130. Terminal 118 is also coupled to secondary coil or inductor 146 of balun 124. The opposite ends of secondary coils 142 and 146 are coupled to ground terminal 130.

Capacitors 140 and 144 provide electrostatic discharge (ESD) protection for balun 124. Capacitors 138, 140, and 144 are implemented using a thin-film dielectric. The thin-film material increases capacitance density. The ESD robustness in thin-film materials can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

The coils or inductors 136, 142, and 146 can have a rectangular, polygonal, or circular form or shape and are wound to create magnetic coupling in balun 124. The coils 136, 142, and 146 are implemented using 8 μm conductive material such as Al, Cu, Sn, Ni, Au, or Ag. The mutual inductance or magnetic coupling strength between coils 136, 142, and 146 is determined by the distance between coils. In one embodiment, the distance between the coils is 10 μm.

Balun 124, signal trace 126, and coupler trace 128 are shown in different areas of the physical layout of FIG. 6. Signal trace 126 and coupler trace 128 can also be interwound with the primary and secondary coils of balun 124 to reduce layout area.

Figure 7:
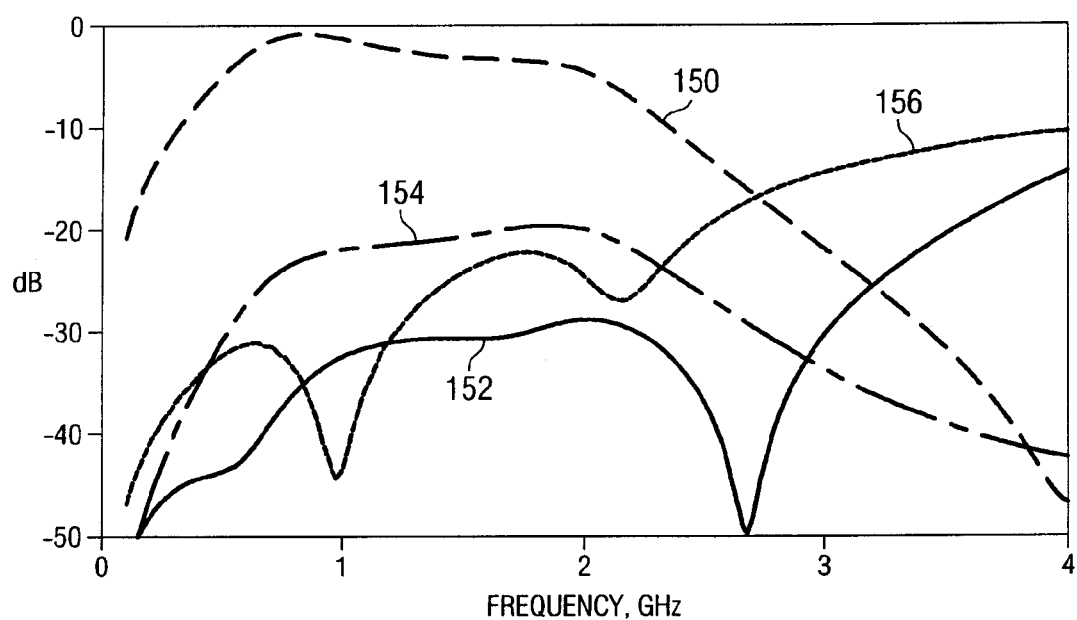
FIG. 7 is a graph of insertion loss, common mode rejection, coupling strength, and reverse coupling versus frequency for the integrated balun and RF coupler.

FIG. 7 is a waveform plot of the electrical response for a GSM band (824 MHz-915 MHz). Plot 150 is insertion loss between terminal 116 and terminal 118; plot 152 is common mode rejection between terminal 116 and terminal 120; plot 154 is coupling strength between terminal 118 and terminal 122; plot 156 is reverse coupling between terminal 116 and terminal 122.

Figure 8:
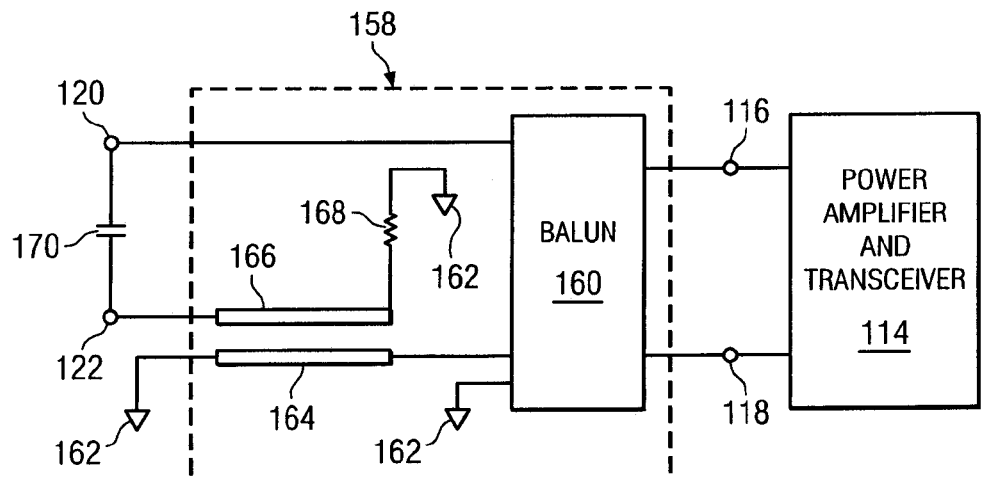
FIG. 8 illustrates another embodiment of the integrated balun and RF coupler.

An alternate embodiment of the balun and RF coupler formed on a common substrate is shown in FIG. 8 as RFIC 158. Balun 160 is a 3-port device: one port coupled to terminal 120, one port coupled to terminal 116, and one port coupled to terminal 118. Balun 160 is coupled to ground potential through terminal 162. A first terminal of ground trace 164 is coupled to a low side of the primary coil or inductor in balun 160, and a second terminal of ground trace 164 is coupled to ground terminal 162. A first terminal of coupler trace 166 is coupled to terminal 122, and a second terminal of coupler trace 166 is coupled through resistor 168 to ground terminal 162. Resistor 168 enables signal directivity. A capacitor 170 is coupled between terminal 120 and terminal 122.

The RF coupler circuit, including ground trace 164, coupler trace 166, resistor 168, and capacitor 170, constitutes an IPD. The RF coupler circuit detects transmitted power through inductive coupling and capacitive coupling between the ground trace 164 and coupler trace 166. Note that resistor 168 and capacitor 170 do not share a common node. The coupler trace 166 is disposed in close proximity to ground trace 164, which in turn is coupled to a low side of the primary coil of balun 160. The detected transmitted power is provided on terminal 122.

Figure 9:
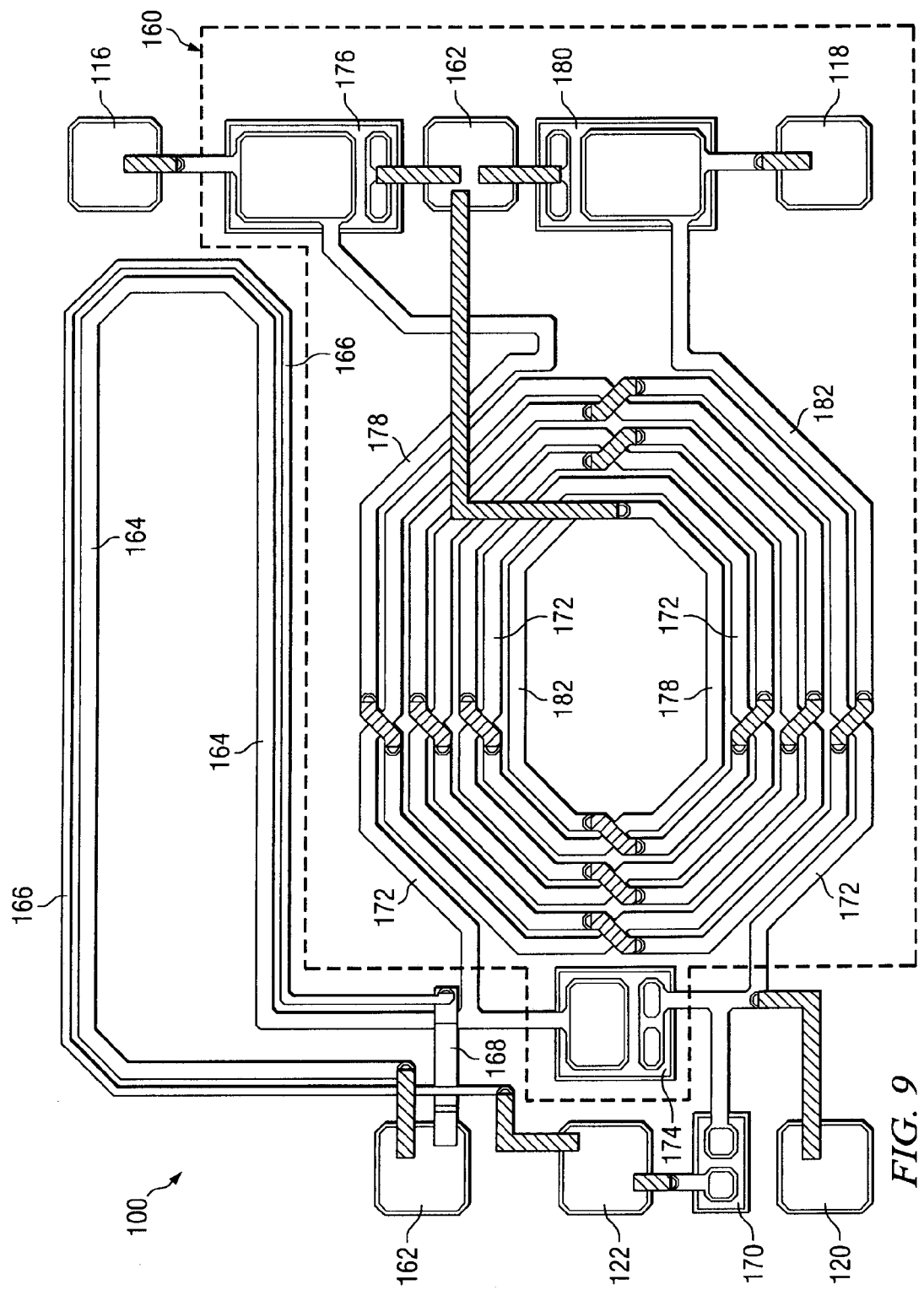
FIG. 9 illustrates a physical circuit layout of the integrated balun and RF coupler of FIG. 8.

FIG. 9 shows a physical circuit layout of RFIC 158 integrated in a small form factor on a common substrate of semiconductor die 100. Terminal 120 is coupled to a high side of primary coil or inductor 172 of balun 160. The first terminal of ground trace 164 is coupled to the low side of primary coil 172, and the second terminal of ground trace 164 is coupled to ground terminal 162. Coupler trace 166 is placed along a substantial length of and in close physical proximity to ground trace 164, separated by 10 μm. Ground trace 164 and coupler trace 166 can be one or more layers of Al, Cu, Sn, Ni, Au, Ag, or other suitable electrically conductive material. Ground trace 164 and coupler trace 16 are formed using evaporation, sputtering, PVD, CVD, electrolytic plating, electroless plating process, or other suitable metal deposition process. The first terminal of coupler trace 166 is coupled to terminal 122, and the second terminal of coupler trace 166 is coupled through resistor strip 168 to ground terminal 162. Capacitor 170 is coupled between terminal 120 and terminal 122. Capacitor 170 can be implemented as two smaller-value capacitors connected in series, as shown in FIG. 6, for better tolerance during the manufacturing process.

Balun 160 further includes capacitor 174 coupled between the high side of primary coil 172 and the low side of primary coil 172. A capacitor 176 is coupled between terminal 116 and ground terminal 162. Terminal 116 is also coupled to secondary coil or inductor 178 of balun 160. A capacitor 180 is coupled between terminal 118 and ground terminal 162. Terminal 118 is also coupled to secondary coil 182 of balun 160. The opposite ends of secondary coils 178 and 182 are coupled to ground terminal 162.

Capacitors 176 and 180 provide ESD protection for balun 160. Capacitors 174, 176, and 180 are implemented using a thin-film dielectric. The thin-film material increases capacitance density. The ESD robustness in thin-film materials can be obtained by using inductive shunt protection across vulnerable capacitors. Most of the energy in an ESD event is concentrated at low frequency, for which inductors in the nano-Henry range are effectively short circuits. In the magnetically-coupled circuit, each capacitor is protected by a low-value shunt inductor to increase robustness to ESD.

The coils or inductors 172, 178, and 182 can have a rectangular, polygonal, or circular form or shape and are wound to create magnetic coupling in balun 160. The coils 172, 178, and 180 are implemented using 8 μm conductive material such as Al, Cu, Sn, Ni, Au, or Ag. The mutual inductance or magnetic coupling strength between coils 172, 178, and 180 is determined by the distance between coils. In one embodiment, the distance between the coils is 10 μm.

Balun 160, ground trace 164, and coupler trace 166 are shown is different areas of the physical layout of FIG. 9. Ground trace 164 and coupler trace 166 can also be interwound with the primary and secondary coils of balun 160 to reduce layout area.

Figure 10:
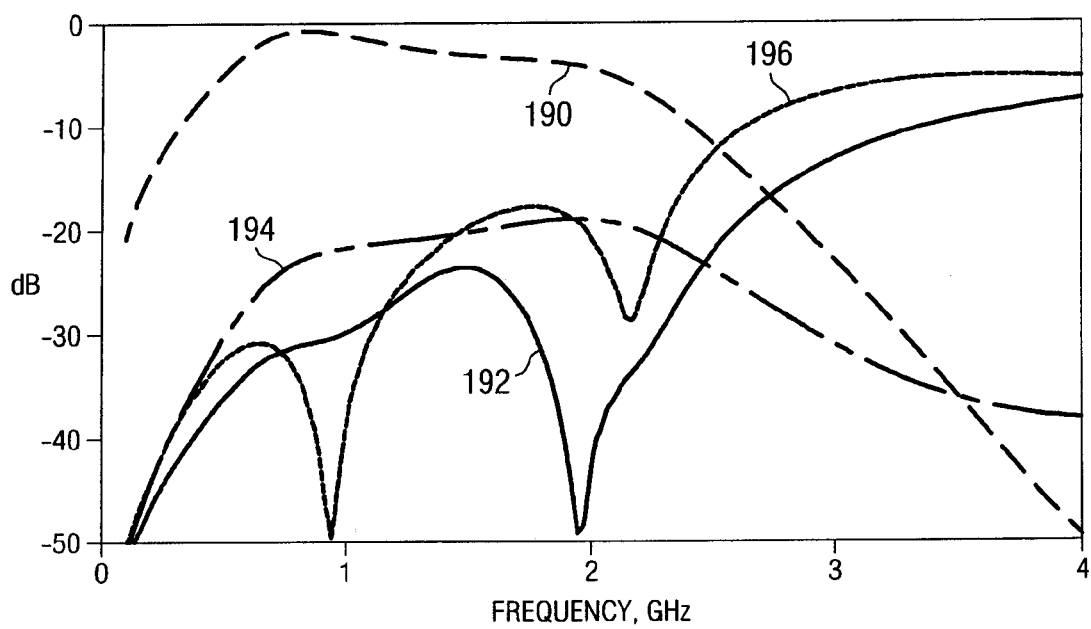
FIG. 10 is a graph of insertion loss, common mode rejection, coupling strength, and reverse coupling versus frequency for the integrated balun and RF coupler of FIG. 8.

FIG. 10 is a waveform plot of the electrical response for a GSM band (824 MHz-915 MHz). Plot 190 is insertion loss between terminal 116 and terminal 118; plot 192 is common mode rejection between terminal 116 and terminal 120; plot 194 is coupling strength between terminal 118 and terminal 122; plot 196 is reverse coupling between terminal 116 and terminal 122.

In summary, the balun and RF coupler have been integrated on a common substrate of a single semiconductor die. The combined IPDs offer flexible coupling strength and signal directivity. The integrated balun and coupler approach improves electrical performance due to short lead lengths, reduces form factor, and increases yield in the manufacturing process.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor die, comprising:
   a substrate;
   a first integrated passive device (IPD) formed over the substrate, the first IPD including,
   (a) a first conductive trace having a first terminal coupled to a first terminal of the semiconductor die,
   (b) a second conductive trace having a first terminal coupled to a second terminal of the semiconductor die, the second conductive trace being formed in proximity to the first conductive trace, and
   (c) a resistor coupled between a second terminal of the second conductive trace and a ground terminal; and
   a second IPD formed over the substrate, the second IPD including,
   (d) a first inductor having a first terminal coupled to a second terminal of the first conductive trace and a second terminal coupled to the ground terminal,
   (e) a second inductor having a first terminal coupled to a third terminal of the semiconductor die and a second terminal coupled to the ground terminal, and
   (f) a third inductor having a first terminal coupled to a fourth terminal of the semiconductor die and a second terminal coupled to the ground terminal, the first inductor being formed in proximity to the second and third inductors.

2. The semiconductor die of claim 1, wherein the first, second, and third inductors operate as a balun.

3. The semiconductor die of claim 1, further including a capacitive component coupled between the first and second terminals of the semiconductor die.

4. The semiconductor die of claim 3, wherein the capacitor component includes first and second capacitors connected in series.

5. The semiconductor die of claim 1, further including:
   a first capacitor coupled between the third terminal of the semiconductor die and ground terminal;
   a second capacitor coupled between the fourth terminal of the semiconductor die and ground terminal; and
   a third capacitor coupled between the first and second terminals of the first inductor.

6. A semiconductor die, comprising:
   a substrate;
   a first integrated passive device (IPD) formed over the substrate, the first IPD including,
   (a) a first conductive trace having a first terminal coupled to a ground terminal,
   (b) a second conductive trace having a first terminal coupled to a first terminal of the semiconductor die, the second conductive trace being formed in proximity to the first conductive trace, and
   (c) a resistor coupled between a second terminal of the second conductive trace and the ground terminal; and
   a second IPD formed over the substrate, the second IPD including,
   (d) a first inductor having a first terminal coupled to a second terminal of the semiconductor die and a second terminal coupled to a second terminal of the first conductive trace,
   (e) a second inductor having a first terminal coupled to a third terminal of the semiconductor die and a second terminal coupled to the ground terminal, and
   (f) a third inductor having a first terminal coupled to a fourth terminal of the semiconductor die and a second terminal coupled to the ground terminal, the first inductor being formed in proximity to the second and third inductors.

7. The semiconductor die of claim 6, wherein the first, second, and third inductors operate as a balun.

8. The semiconductor die of claim 6, further including a capacitor coupled between the first and second terminals of the semiconductor die.

9. The semiconductor die of claim 6, further including:
   a first capacitor coupled between the third terminal of the semiconductor die and ground terminal;
   a second capacitor coupled between the fourth terminal of the semiconductor die and ground terminal; and
   a third capacitor coupled between the first and second terminals of the first inductor.

10. A semiconductor die, comprising:
    a substrate;
    a first integrated passive device (IPD) formed over the substrate, the first IPD including an RF coupler; and
    a second IPD formed over the substrate and electrically connected to the RF coupler, the second IPD including a balun having,
    (a) a first inductor, and
    (b) a second inductor interwound with the first inductor to partially overlap with the first inductor.

11. The semiconductor die of claim 10, wherein the first IPD includes:
    a first conductive trace having a first terminal coupled to a first terminal of the semiconductor die;
    a second conductive trace having a first terminal coupled to a second terminal of the semiconductor die, the second conductive trace being formed in proximity to the first conductive trace; and
    a resistor coupled between a second terminal of the second conductive trace and a ground terminal.

12. The semiconductor die of claim 11, wherein the second IPD includes:
    the first inductor having a first terminal coupled to a second terminal of the first conductive trace and a second terminal coupled to the ground terminal;
    the second inductor having a first terminal coupled to a third terminal of the semiconductor die and a second terminal coupled to the ground terminal; and
    a third inductor having a first terminal coupled to a fourth terminal of the semiconductor die and a second terminal coupled to the ground terminal, the first inductor being formed in proximity to the second and third inductors.

13. The semiconductor die of claim 10, wherein the first IPD includes:
- a first conductive trace having a first terminal coupled to a ground terminal;
- a second conductive trace having a first terminal coupled to a first terminal of the semiconductor die, the second conductive trace being formed in proximity to the first conductive trace; and
- a resistor coupled between a second terminal of the second conductive trace and the ground terminal.

14. The semiconductor die of claim 13, wherein the second IPD includes:
- the first inductor having a first terminal coupled to a second terminal of the semiconductor die and a second terminal coupled to a second terminal of the first conductive trace;
- the second inductor having a first terminal coupled to a third terminal of the semiconductor die and a second terminal coupled to the ground terminal; and
- a third inductor having a first terminal coupled to a fourth terminal of the semiconductor die and a second terminal coupled to the ground terminal, the first inductor being formed in proximity to the second and third inductors.

15. The semiconductor die of claim 10, further including a capacitive component coupled between first and second terminals of the semiconductor die.

16. The semiconductor die of claim 15, wherein the capacitor component includes first and second capacitors connected in series.

17. The semiconductor die of claim 10, further including:
- a first capacitor coupled between a third terminal of the semiconductor die and a ground terminal; and
- a second capacitor coupled between a fourth terminal of the semiconductor die and the ground terminal.

18. The semiconductor die of claim 10, wherein the second IPD further includes a third inductor interwound with the first and second inductors to partially overlap with the first and second inductors.

19. A method of making a semiconductor die, comprising:
- providing a substrate;
- forming a first integrated passive device (IPD) over the substrate, the first IPD including an RF coupler;
- forming a second IPD over the substrate, the second IPD including a balun electrically connected to the RF coupler; and
- forming a capacitor between first and second terminals of the semiconductor die.

20. The method of claim 19, further including:
- forming a first capacitor between a third terminal of the semiconductor die and a ground terminal; and
- forming a second capacitor between a fourth terminal of the semiconductor die and the ground terminal.

21. The method of claim 19, wherein forming the first IPD includes:
- forming a first conductive trace having a first terminal coupled to a ground terminal;
- forming a second conductive trace having a first terminal coupled to a first terminal of the semiconductor die, the second conductive trace being formed in proximity to the first conductive trace; and
- forming a resistor between a second terminal of the second conductive trace and the ground terminal.

22. The method of claim 21, wherein forming the second IPD includes:
- forming a first inductor having a first terminal coupled to a second terminal of the semiconductor die and a second terminal coupled to a second terminal of the first conductive trace;
- forming a second inductor having a first terminal coupled to a third terminal of the semiconductor die and a second terminal coupled to the ground terminal; and
- forming a third inductor having a first terminal coupled to a fourth terminal of the semiconductor die and a second terminal coupled to the ground terminal, the first inductor being formed in proximity to the second and third inductors.

23. The method of claim 19, wherein forming the first IPD includes:
- forming a first conductive trace having a first terminal coupled to a first terminal of the semiconductor die;
- forming a second conductive trace having a first terminal coupled to a second terminal of the semiconductor die, the second conductive trace being formed in proximity to the first conductive trace; and
- forming a resistor between a second terminal of the second conductive trace and a ground terminal.

24. The method of claim 23, wherein forming the second IPD includes:
- forming a first inductor having a first terminal coupled to a second terminal of the first conductive trace and a second terminal coupled to the ground terminal;
- forming a second inductor having a first terminal coupled to a third terminal of the semiconductor die and a second terminal coupled to the ground terminal; and
- forming a third inductor having a first terminal coupled to a fourth terminal of the semiconductor die and a second terminal coupled to the ground terminal, wherein the first inductor is formed in proximity to the second and third inductors.

25. A method of making a semiconductor die, comprising:
- providing a substrate;
- forming a first integrated passive device (IPD) over the substrate, the first IPD including an RF coupler;
- forming a second IPD over the substrate by,
  - (a) forming a first inductor, and
  - (b) forming a second inductor interwound with the first inductor to partially overlap with the first inductor.

26. The method of claim 25, wherein forming the first IPD includes:
- forming a first conductive trace having a first terminal coupled to a first terminal of the semiconductor die;
- forming a second conductive trace having a first terminal coupled to a second terminal of the semiconductor die, the second conductive trace being formed in proximity to the first conductive trace; and
- forming a resistor between a second terminal of the second conductive trace and a ground terminal.

27. The method of claim 26, wherein forming the second IPD includes:
- forming the first inductor having a first terminal coupled to a second terminal of the first conductive trace and a second terminal coupled to the ground terminal;
- forming the second inductor having a first terminal coupled to a third terminal of the semiconductor die and a second terminal coupled to the ground terminal; and
- forming a third inductor having a first terminal coupled to a fourth terminal of the semiconductor die and a second terminal coupled to the ground terminal, the first inductor being formed in proximity to the second and third inductors.

28. The method of claim 25, wherein forming the first IPD includes:
- forming a first conductive trace having a first terminal coupled to a ground terminal;
- forming a second conductive trace having a first terminal coupled to a first terminal of the semiconductor die, the second conductive trace being formed in proximity to the first conductive trace; and
- forming a resistor between a second terminal of the second conductive trace and the ground terminal.

29. The method of claim 28, wherein forming the second IPD includes:
- forming the first inductor having a first terminal coupled to a second terminal of the semiconductor die and a second terminal coupled to a second terminal of the first conductive trace;
- forming the second inductor having a first terminal coupled to a third terminal of the semiconductor die and a second terminal coupled to the ground terminal; and
- forming a third inductor having a first terminal coupled to a fourth terminal of the semiconductor die and a second terminal coupled to the ground terminal, the first inductor being formed in proximity to the second and third inductors.

30. The method of claim 25, further including forming a capacitor between first and second terminals of the semiconductor die.

31. The method of claim 25, wherein forming the second IPD further includes forming a third inductor interwound with the first and second inductors to partially overlap with the first and second inductors.

* * * * *